(12) United States Patent
Biebricher et al.

(10) Patent No.: US 9,961,779 B2
(45) Date of Patent: May 1, 2018

(54) METHOD FOR PRODUCING AN ELECTRONIC ASSEMBLY

(71) Applicant: Continental Teves AG & Co. oHG, Frankfurt (DE)

(72) Inventors: Lothar Biebricher, Oberursel (DE); Michael Schulmeister, Groβ-Zimmern (DE); Jakob Schillinger, Gaimersheim (DE); Dietmar Huber, Rödermark (DE); Thomas Fischer, Frankfurt am Main (DE); Stefan Günthner, Frankfurt am Main (DE); Waldemar Baumung, Pfungstadt (DE)

(73) Assignee: Continental Teves AG & Co. oHG, Frankfurt (DE)

( * ) Notice: Subject to any disclaimer, the term of this patent is extended or adjusted under 35 U.S.C. 154(b) by 120 days.

(21) Appl. No.: 14/652,507

(22) PCT Filed: Dec. 10, 2013

(86) PCT No.: PCT/EP2013/076134
§ 371 (c)(1),
(2) Date: Jun. 16, 2015

(87) PCT Pub. No.: WO2014/095500
PCT Pub. Date: Jun. 26, 2014

(65) Prior Publication Data
US 2015/0351252 A1    Dec. 3, 2015

(30) Foreign Application Priority Data
Dec. 20, 2012 (DE) ................. 10 2012 223 982

(51) Int. Cl.
*H05K 1/18* (2006.01)
*H05K 3/30* (2006.01)
(Continued)

(52) U.S. Cl.
CPC .......... *H05K 3/30* (2013.01); *H01L 23/3121* (2013.01); *H01L 23/3128* (2013.01);
(Continued)

(58) Field of Classification Search
CPC ..... H01L 2924/00012; H01L 2224/291; H01L 2224/32245; H01L 2224/48247;
(Continued)

(56) References Cited

U.S. PATENT DOCUMENTS 7,094,626 B2   8/2006  Stelzl
7,243,561 B2   7/2007  Ishigami et al.
(Continued)

FOREIGN PATENT DOCUMENTS

CN    1561574 A      1/2005
CN    101616864 A    12/2009
(Continued)

OTHER PUBLICATIONS

German Search Report for German Application No. 10 2012 223 982.0 dated Jul. 5, 2013, including partial translation.
(Continued)

*Primary Examiner* — Yuriy Semenenko
(74) *Attorney, Agent, or Firm* — RatnerPrestia

(57) ABSTRACT

A method for producing an electronic assembly in which an electronic component supported on a wiring support is encapsulated with an encapsulation material, the method including: —arranging the electronic component on the wiring support in such a manner that a stress applied onto the electronic component by the encapsulation material falls below a predetermined value; and —encapsulating the electronic component with the encapsulation material.

9 Claims, 5 Drawing Sheets

(51) Int. Cl.
*H01L 23/31* (2006.01)
*H01L 23/00* (2006.01)
*H01L 23/552* (2006.01)
*H01L 23/495* (2006.01)

(52) U.S. Cl.
CPC ........ *H01L 23/3135* (2013.01); *H01L 23/562* (2013.01); *H05K 1/186* (2013.01); *H01L 23/495* (2013.01); *H01L 23/552* (2013.01); *H01L 24/16* (2013.01); *H01L 24/29* (2013.01); *H01L 24/32* (2013.01); *H01L 24/48* (2013.01); *H01L 24/73* (2013.01); *H01L 2224/0401* (2013.01); *H01L 2224/04042* (2013.01); *H01L 2224/16145* (2013.01); *H01L 2224/291* (2013.01); *H01L 2224/2919* (2013.01); *H01L 2224/32245* (2013.01); *H01L 2224/48091* (2013.01); *H01L 2224/48137* (2013.01); *H01L 2224/48227* (2013.01); *H01L 2224/48247* (2013.01); *H01L 2224/73265* (2013.01); *H01L 2924/00014* (2013.01); *H01L 2924/1433* (2013.01); *H01L 2924/1461* (2013.01); *H01L 2924/181* (2013.01); *H01L 2924/19105* (2013.01); *Y10T 29/49147* (2015.01)

(58) Field of Classification Search
CPC ..... H01L 2224/73265; H01L 2924/181; H01L 2924/014; H01L 2224/0401; H01L 2224/04042; H01L 2224/16145; H01L 2224/2919; H01L 2224/48091; H01L 2224/48137
See application file for complete search history.

(56) References Cited

U.S. PATENT DOCUMENTS

| | | | |
|---|---|---|---|
| 7,608,789 B2 | 10/2009 | Kruger | |
| 7,679,914 B2 | 3/2010 | Kashiwazaki | |
| 8,279,615 B2 | 10/2012 | Schmid et al. | |
| 8,404,516 B2 | 3/2013 | Bauer | |
| 8,609,465 B2 | 12/2013 | Kawahara | |
| 9,014,921 B2 | 4/2015 | Bretzigheimer | |
| 2004/0239449 A1 | 12/2004 | Stelzl | |
| 2004/0262782 A1 | 12/2004 | Ellis | |
| 2010/0290199 A1* | 11/2010 | Schmid | B81C 1/0023 361/752 |
| 2011/0037155 A1 | 2/2011 | Pagaila | |
| 2012/0231584 A1* | 9/2012 | Kawahara | H01L 21/565 438/122 |
| 2012/0280381 A1* | 11/2012 | Beyne | H01L 23/3128 257/680 |
| 2013/0240909 A1 | 9/2013 | Hiramatsu | |

FOREIGN PATENT DOCUMENTS

| | | |
|---|---|---|
| CN | 102576682 B | 1/2015 |
| DE | 10330739 | 9/2004 |
| DE | 102004039229 | 2/2006 |
| DE | 102007060931 | 8/2008 |
| DE | 102007025992 | 12/2008 |
| DE | 102008043773 | 5/2010 |
| DE | 102011080789 | 2/2012 |
| EP | 0515094 A1 | 11/1992 |
| EP | 2339627 | 6/2011 |
| EP | 2487710 | 8/2012 |
| JP | 06252284 | 9/1994 |
| JP | 2003243598 A | 8/2003 |
| JP | 2008084978 | 4/2008 |
| JP | 2008258478 | 10/2008 |
| JP | 2009226571 | 10/2009 |
| JP | 2009302526 | 12/2009 |
| JP | 2010080901 | 4/2010 |
| WO | 2005019790 A1 | 3/2005 |
| WO | 2012070261 | 5/2012 |

OTHER PUBLICATIONS

International Search Report for International Application No. PCT/EP2013/076134 dated Mar. 18, 2014.

* cited by examiner

METHOD FOR PRODUCING AN ELECTRONIC ASSEMBLY

CROSS REFERENCE TO RELATED APPLICATIONS

This application is the U.S. National Phase Application of PCT International Application PCT/EP2013/076134, filed Dec. 10, 2013, which claims priority to German Patent Application No. 10 2012 223 982.0, filed Dec. 20, 2012, the contents of such applications being incorporated by reference herein.

FIELD OF THE INVENTION

The invention relates to a method for producing an electronic assembly and to an electronic assembly.

BACKGROUND OF THE INVENTION

An electronic assembly having an encapsulated electronic component (referred to in the document as an encapsulated structure), which is held on a substrate in the form of a printed circuit board having an electrical circuit and is interconnected via bond wires with the electrical circuit, is known from DE 10 2007 060 931 A1, which is incorporated by reference. The substrate having the electronic component is fixed in a housing, which is potted using an embedding material. The potted housing is closed using a cover which is used as a shield.

SUMMARY OF THE INVENTION

An aspect of the present invention improves the known electronic assembly.

According to one aspect of the invention, a method for producing an electronic assembly, in which an electronic component supported on a wiring carrier is encapsulated using an encapsulation material, comprises the steps of arranging the electronic component on the wiring carrier such that a stress introduction through the encapsulation material onto the electronic component falls below a predetermined value, and encapsulating the electronic component using the encapsulation material.

The specified method is based on the consideration that the electronic assembly mentioned at the outset is dimensioned very large, which is because the electronic component is first independently encapsulated and subsequently must be embedded using a further material for the fixing in a housing. Accordingly, the structures require a very large amount of installation space, whereby the electronic assembly of the type mentioned at the outset is unsuitable for technical applications having little installation space, for example, as a surface-mounted device, referred to hereafter as an SMD.

In contrast, the specified method is based on the idea of using the embedding of the electronic component directly as a housing, so that an extra housing around the embedding can be omitted. This would noticeably reduce the required installation space for the entire electronic assembly.

However, this concept is based on the finding that the embedding must have a specific elasticity and/or viscosity to prevent an excessively high mechanical stress introduction onto the electronic assembly and/or its electrical connections such as bond wires, because this mechanical stress introduction could electrically and/or mechanically damage the electronic assembly and/or the electrical connections, and thus result in corresponding malfunctions.

It is therefore the concept of the specified method, when preparing the electronic assembly to be produced, to take the stress introduction into consideration in its dimensioning and to take suitable precautions so that the stress introduction remains below a limiting value, at which the function of the entire electronic assembly can no longer be reliably ensured. Examples of how the stress introduction can be taken into consideration in the dimensioning of the electronic assembly are specified in the dependent claims.

The predetermined value for the stress introduction can result directly or indirectly during the dimensioning in this case. A direct specification can be implemented, for example, in the scope of a simulation, in which the predetermined value is directly predefined. An indirect specification can be implemented, for example, on the basis of an array of comparison tests, in the scope of which only one result to be expected, for example, a specific failure safety, is predefined and from which the predetermined value then implicitly results.

In a refinement of the specified method, the encapsulation material has a coefficient of thermal expansion which is in the range of a coefficient of thermal expansion of the electronic component, so that the encapsulation material and the electronic assembly encapsulated thereby expand in the same manner and therefore apply no or only minimal mechanical stress in relation to one another.

The encapsulation material can comprise a curable resin, in particular an epoxy resin, so that the encapsulation of the electronic component can be carried out in a manner known to one skilled in the art by means of transfer molding.

In another refinement of the specified method, the electronic component can be arranged at a zero position of the wiring carrier, at which the thermal movements of the encapsulation material cancel each other out. A stress introduction can also be reduced in this manner.

The electronic component can be an analysis circuit for analyzing measurement signals from at least two encoder elements in this case, wherein the two encoder elements can be arranged symmetrically around the analysis circuit. In this manner, a stress introduction onto the encoder elements and a possible measurement error linked thereto can be taken into consideration subsequently on the basis of the known symmetry.

In yet another refinement of the specified method, for the encapsulation of the electronic component using the encapsulation material, an encapsulation geometry can be selected, in the case of which a thermal movement of the encapsulation material in at least one direction falls below a predetermined value. This geometry can be selected in an arbitrary manner, wherein the encapsulation geometry is particularly preferably selected such that a wall thickness of the encapsulation material on at least one wall of the electronic component falls below a predetermined value, so that the mechanical stress applied by the wall remains limited to a stress value dependent on this predetermined value.

In yet another refinement, the specified method comprises the step of enveloping the electronic component with a mechanical decoupling material before the encapsulation. The mechanical decoupling material further reduces the stress introduction into the electronic assembly and thus reduces the mechanical strain of the electronic component.

In a special refinement, the mechanical decoupling material is at least made thixotropic. In this manner, the mechanical decoupling material may be poured in a simple manner onto the electronic component, but has a sufficient stability in the poured-on state to completely envelop the electronic component.

In an additional refinement, the wiring carrier comprises a terminal for electrically contacting the electronic component with a printed circuit board and an electrical shielding layer, wherein the specified method comprises the step of arranging the electronic component on the wiring carrier such that the electronic component is accommodated, viewed in at least one direction of the electrical assembly, between the electrical shielding layer and the terminal. In this manner, the wiring carrier can simultaneously be used for improving the electromagnetic compatibility (EMC), without an extra electrical shielding layer being necessary.

According to a further aspect, the invention comprises an electronic assembly, an electronic component supported on a wiring carrier, which is encapsulated using an encapsulation material, wherein the electronic component is arranged on the wiring carrier such that a stress introduction through the encapsulation material onto the electronic component falls below a predetermined value.

The specified electronic assembly can be expanded with features which correspond in meaning to the dependent claims of the specified method.

In a refinement of the specified electronic assembly, the specified electronic assembly is designed as an inertial sensor.

The specified electronic assembly can preferably be produced using a specified method in this case.

According to a further aspect of the invention, a vehicle comprises a specified electronic assembly, in particular for detecting vehicle dynamics data.

BRIEF DESCRIPTION OF THE DRAWINGS

The above-described properties, features, and advantages of this invention and the manner in which they are achieved will become clearer and more comprehensible in conjunction with the following description of the exemplary embodiments, which will be explained in greater detail in conjunction with the drawings, wherein.

DETAILED DESCRIPTION OF THE PREFERRED EMBODIMENTS

Identical technical elements are provided with identical reference signs in the figures and are only described once.

Figure 1:
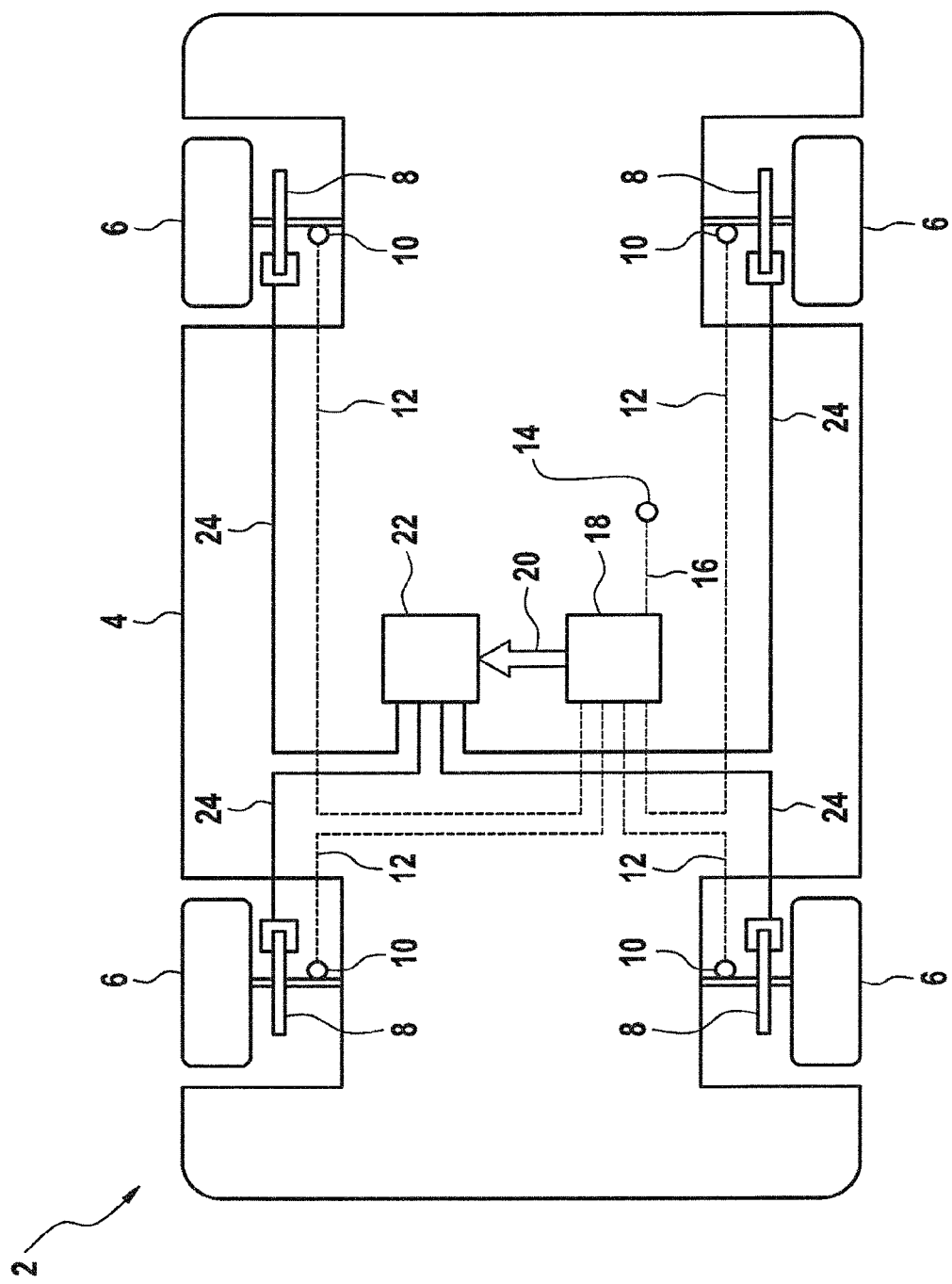
FIG. 1 shows a schematic view of a vehicle having a vehicle dynamics controller.

Reference is made to FIG. 1, which shows a schematic view of a vehicle 2 having a vehicle dynamics controller known per se. Details of this vehicle dynamics controller can be inferred, for example, from DE 10 2011 080 789 A1, which is incorporated by reference.

The vehicle 2 comprises a chassis 4 and four wheels 6. Each wheel 6 can be decelerated in relation to the chassis 4 via a brake 8 which is fastened in a stationary manner on the chassis 4, to decelerate a movement of the vehicle 2 on a road (not shown in greater detail).

In this case, it can occur in a manner known to a person skilled in the art that the wheels 6 of the vehicle 2 lose their ground contact and the vehicle 2 even moves away from a trajectory, which is predefined for example via a steering wheel (not shown in greater detail), due to understeer or oversteer. This is prevented by control circuits known per se such as antilock braking systems (ABS) and electronic stability programs (ESP).

In the present embodiment, the vehicle 2 has speed sensors 10 on the wheels 6 for this purpose, which detect a speed 12 of the wheels 6. Furthermore, the vehicle 2 has an inertial sensor 14, which detects vehicle dynamics data 16 of the vehicle 2, from which, for example, a pitch rate, a roll rate, a yaw rate, a lateral acceleration, a longitudinal acceleration, and/or a vertical acceleration can be output in a way known per se to a person skilled in the art.

Based on the detected speeds 12 and vehicle dynamics data 16, a controller 18 can determine in a way known to a person skilled in the art whether the vehicle 2 is slipping on the roadway or is even deviating from the above-mentioned predefined trajectory and can react thereto accordingly using a controller output signal 20 known per se. The controller output signal 20 can then be used by a positioning unit 22 to activate actuators, such as the brakes 8, by means of positioning signals 24, which react to the slipping and the deviation from the predefined trajectory in a manner known per se.

The controller 18 can be integrated, for example, in an engine controller, known per se, of the vehicle 2. The controller 18 and the positioning unit 22 can also be designed as a shared control unit and can optionally be integrated in the above-mentioned engine controller.

In FIG. 1, the inertial sensor 14 is shown as an external unit outside the controller 18. In such a case, one refers to an inertial sensor 14 designed as a satellite. However, in the present embodiment, the inertial sensor 14 is to be constructed as an SMD part, so that it can also be integrated in a housing of the controller 18, for example.

The inertial sensor 14 comprises at least one microelectromechanical system 26 (MEMS 26), as a measurement pickup, which, in a manner known per se, outputs a signal (not shown in greater detail) dependent on the vehicle dynamics data 16 via bond wires 28 to two signal analysis circuits 30 in the form of application-specific integrated circuit 30 (ASIC 30). The ASIC 30 can then generate the vehicle dynamics data 16 based on the received signal, which is dependent on the vehicle dynamics data 16.

The MEMS 26 and the ASIC 30 are supported on a printed circuit board 32 and are electrically contacted with various electrical circuits 34 formed on the printed circuit board 32. Alternatively, the printed circuit board 32 can also be designed as a lead frame, which will be described in greater detail hereafter. Of the lines 34, only a single line 34 is visible in section in FIG. 2. The contacting can be performed directly in this case, for example, via a flip chip connection known per se or, as shown in FIG. 2, via a bond wire 28.

The MEMS 26 and the ASIC 30 can furthermore be enveloped by a mechanical decoupling material 36, known as globe top mass 36, which can in turn be encapsulated jointly with the MEMS 26 and the ASIC 30 in a transfer molding material 38, for example, an epoxy resin 38.

The transfer molding material 38 could therefore already be used alone as the housing of the inertial sensor 14 and protect the circuit components accommodated therein.

Figure 2:
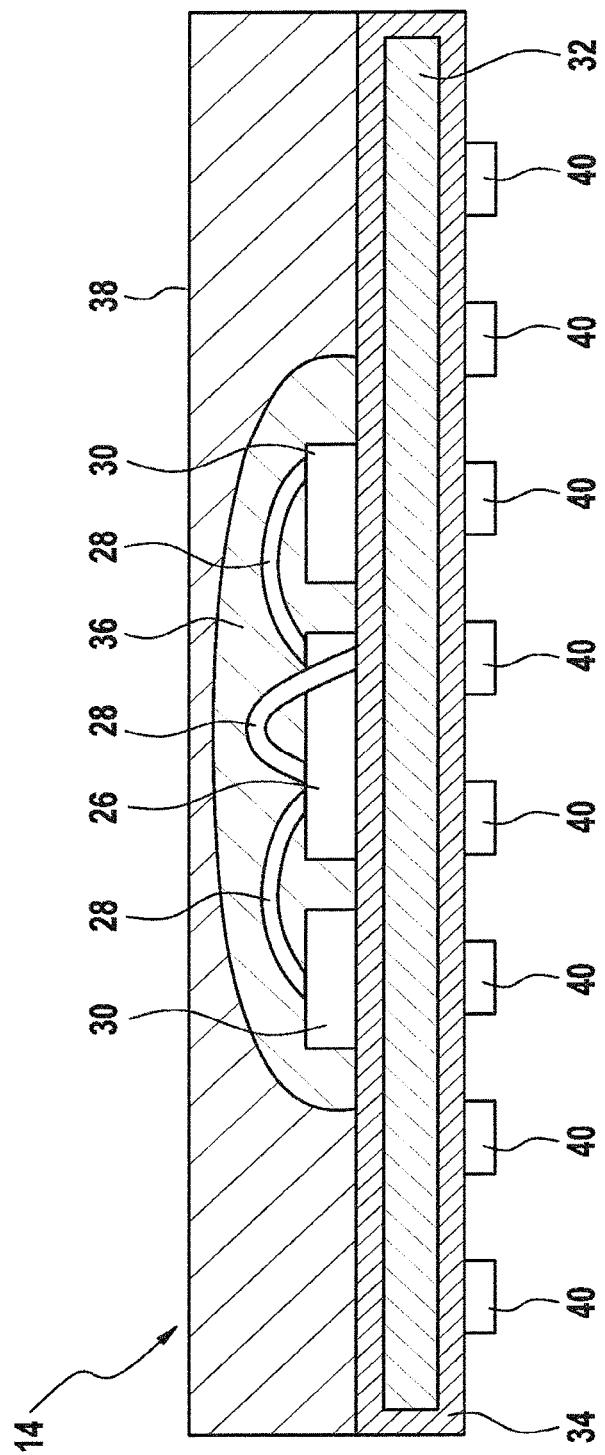
FIG. 2 shows a schematic view of an inertial sensor from FIG. 1 designed as an SMD part.

Finally, corresponding contact options, such as solder beads 40 shown in FIG. 2, are provided on the inertial sensor 14 designed as an SMD part for electrically contacting a circuit of the controller 18. Alternatively, the contact options of the inertial sensor 14 designed as an SMD part could, however, be designed as gullwing solder terminals or J-lead solder terminals known per se, if the substrate is designed as a lead frame 32, which is known per se and is shown in FIG. 3.

Figure 3:
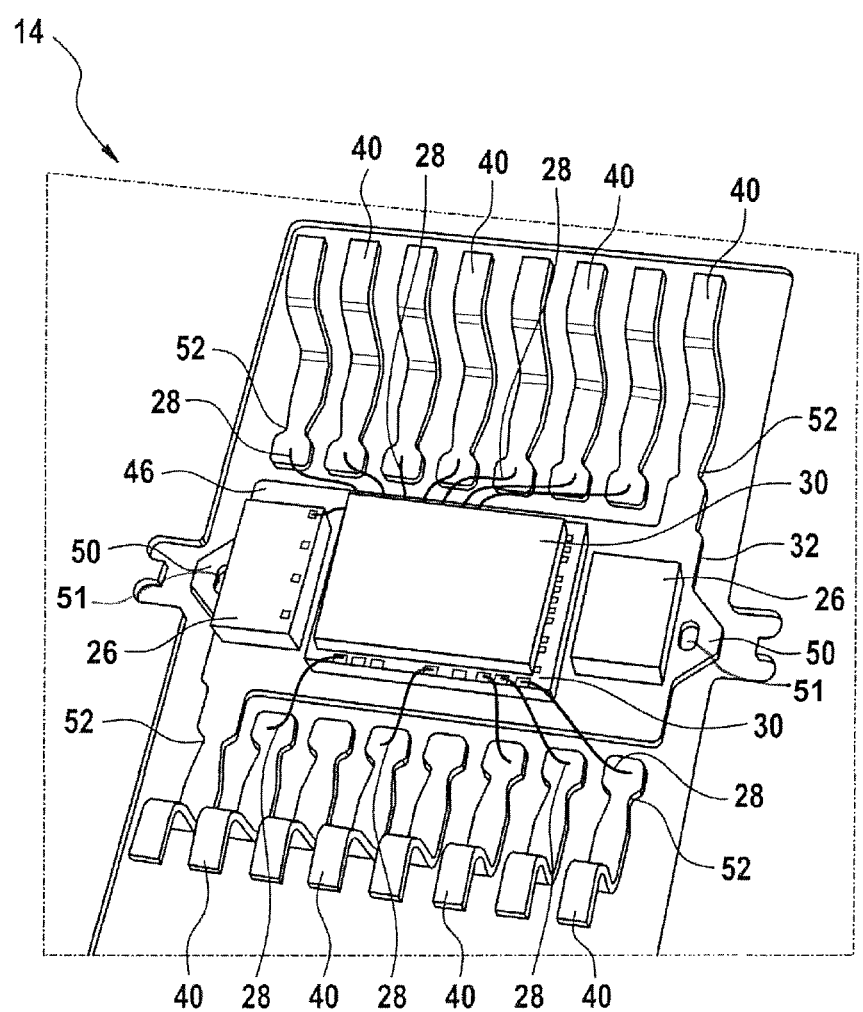
FIG. 3 shows a schematic view of an intermediate product of an inertial sensor from FIG. 1.

Reference is made to FIG. 3, on the basis of which the internal structure of the inertial sensor 14 is to be explained. To illustrate the manifold options for how the inertial sensor 14 can be implemented as an SMD part, instead of solder beads 40 as contact options, contact pins 40 are formed as contact options in FIG. 3.

In FIG. 3, instead of on a printed circuit board 32 as a wiring carrier, the MEMS 26 and the ASIC 30 are supported on a lead frame 32 as a wiring carrier, on which contact pins 40 are formed, via which the MEMS 26 and the ASIC 30 can be electrically connected to the above-mentioned circuit of the controller 18. For the sake of comprehensibility, not all of these contact pins are provided with a reference sign in FIG. 3.

The MEMS 26 and the ASIC 30 can be fixed on the lead frame 32 by soldering, gluing, and/or adhesive films, such as DAF tapes known per se. The electrical contacting can be produced in this case via the fixing and/or via bond wires 28, not all of which are provided with a reference sign for the sake of comprehensibility.

In the present embodiment, a further MEMS 26 can alternatively or additionally be supported on the ASIC 30, which can either also be used as an encoder element for detecting the vehicle dynamics data 16 or as an alternative encoder element, for example, for detecting a temperature or another physical variable. Further electrical components, for example, passive components, could also be interconnected on this lead frame in a manner which is not shown.

Observed into the plane of the image of FIG. 3, the ASIC 30 and the MEMS 26 can be supported on a metal layer 46, which is used as an electrical shielding layer 46 and thus increases the EMC of the fusion sensor 14. In this manner, the EMC of the fusion sensor 14 can be noticeably improved by supporting the entire electronic assembly on a printed circuit board 48 shown in FIG. 4, on the one hand, and by the electrical shielding layer 46, on the other hand.

To envelop the ASIC 30 and the MEMS 26 with the above-mentioned decoupling material 36 and/or to encapsulate them using the transfer molding material 38, tabs 50 are formed on the lead frame 32, on which the lead frame 32 can be mechanically fixed during the enveloping and/or encapsulation procedure.

Since the tabs 50 represent a penetration of the lead frame 32 through the transfer molding material 38 to the outside, the tab offers an access for moisture to the ASIC 30 and the MEMS 26. To make it more difficult for this moisture to penetrate, recesses 51 are formed on the tabs 50, which reduce the cross section of the above-mentioned penetration of the lead frame 32 through the transfer molding material 38 to the outside. At the same time, the transfer molding material 38 and therefore the encapsulation of the ASIC 30 and the MEMS 26 are further anchored in the recess 51.

The individual contact pins 40 have anchoring elements in this case, which are formed as notches 52 in the present embodiment, for example, at which the contact pins 40 are tapered. Not all of these notches are provided with a reference sign in FIG. 3 for the sake of comprehensibility. The notches 52 can be enclosed by the transfer molding material 38, to prevent the contact pins 40 from subsequently being pulled out of the transfer molding material 38.

In addition, the anchoring elements, which are formed as notches 52 as an example, limit the movement of the contact pins 40 as a result of thermal expansion, vibration, etc. within the transfer molding material 38, which prevents damage to the bond wires 28 or the electrical connection thereof to the contact pins 40, for example, due to shear forces arising in this manner.

Figure 4:
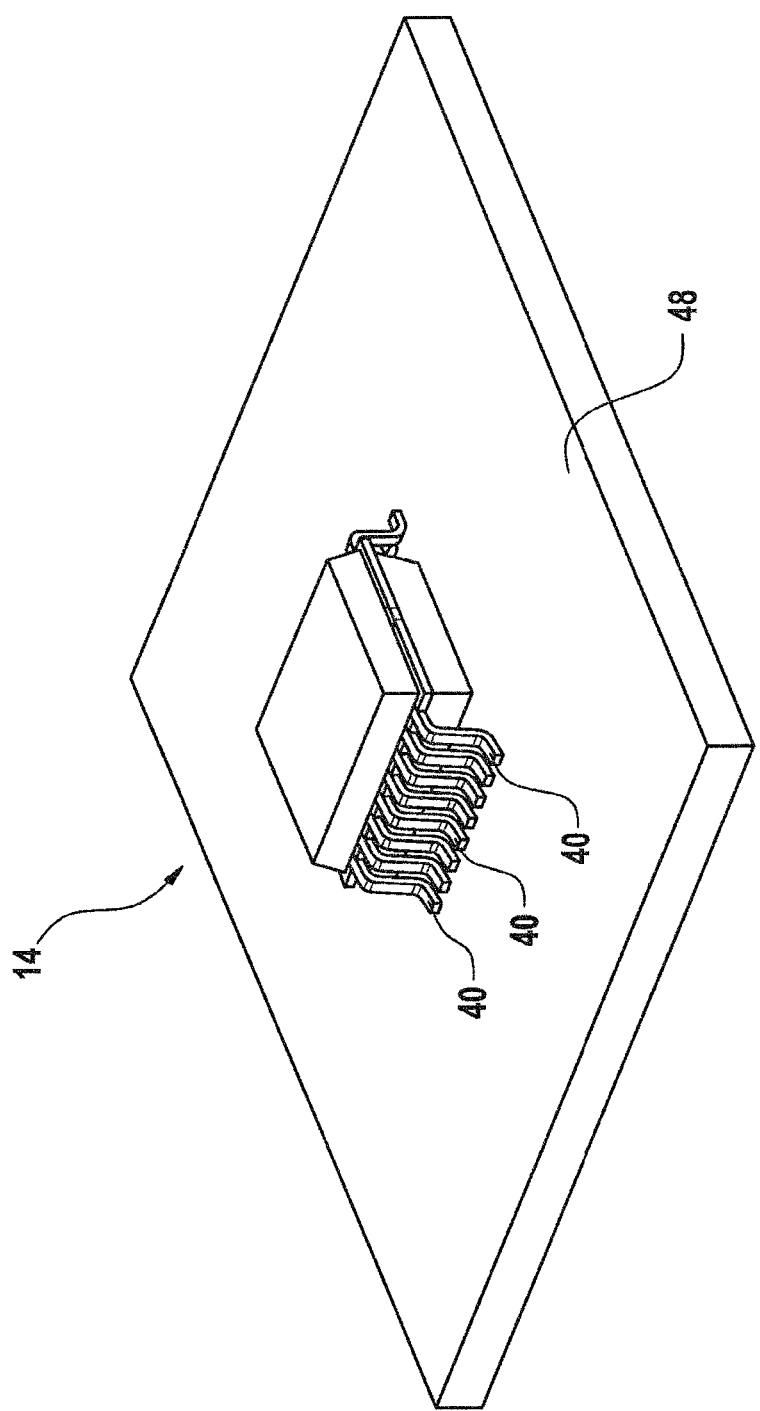
FIG. 4 shows a schematic view of an inertial sensor from FIG. 1 on a printed circuit board.

The finished fusion sensor 14 is shown supported on the printed circuit board 48 in FIG. 4, on which the controller 18 can be wired (not shown further), for example.

Figure 5:
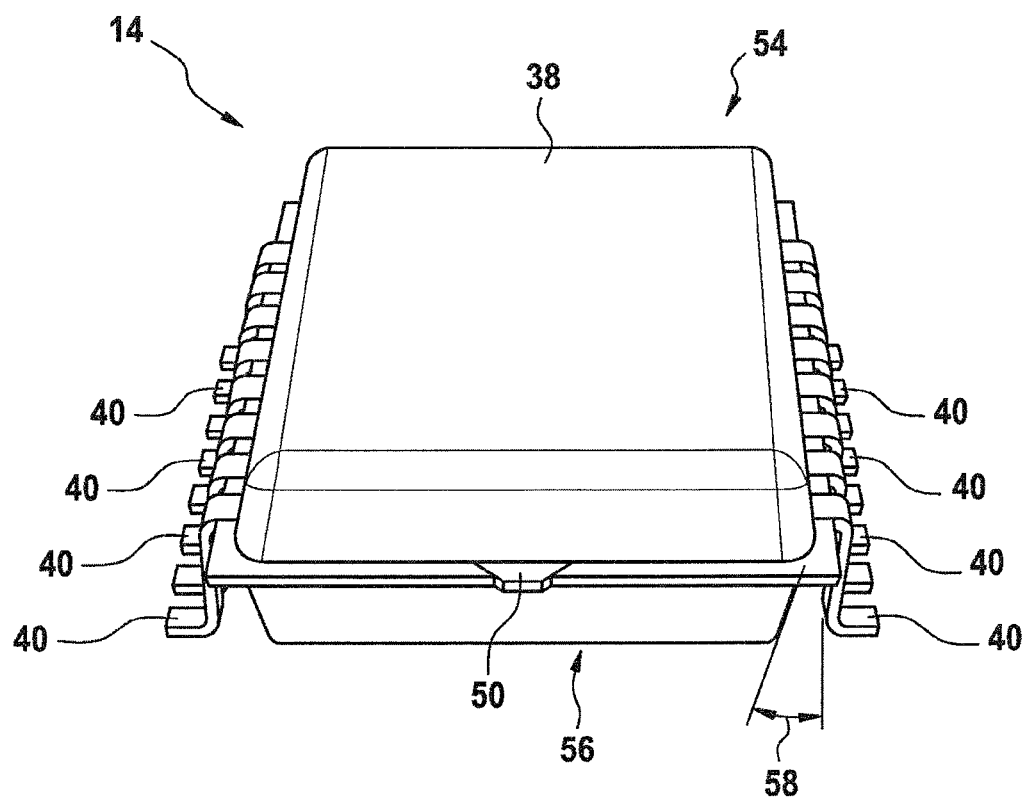
FIG. 5 shows a further schematic view of the inertial sensor from FIG. 1.

The volume of the transfer molding material 38 which is formed as the encapsulation material as an example, observed from the lead frame 32, minus the volume of the ASIC 30 and the MEMS 26, is to be equal or deviate at most by 30% from one another on the upper side 54 and the lower side 56 as shown in FIG. 5. In this manner, an unequal shrinkage and reduced warping are achieved, which keeps the internal tensions of the cast transfer molding material 38 low and therefore further reduces or even avoids mechanical strains of the ASIC 30 and the MEMS 26 and also the bond wires.

To ensure demolding in a tool during the production of the fusion sensor 14, demolding bevels 58 of at least 5° are to be formed, of which only one is provided with a reference sign in FIG. 5 for the sake of comprehensibility.

The invention claimed is:

1. A method for producing an electronic assembly, in which an electronic component supported on a wiring carrier is encapsulated using an encapsulation material, comprising:
   arranging the electronic component on the wiring carrier at a position of the wiring carrier at which movements of the encapsulation material caused by changes in temperature of the encapsulation material during an encapsulating process cancel each other out such that a stress introduction through the encapsulation material onto the electronic component during the encapsulating process falls below a predetermined value, and
   encapsulating the electronic component using the encapsulation material, wherein the electronic component is an analysis circuit for analyzing measurement signals from at least two encoder elements, which are arranged symmetrically around the analysis circuit.

2. The method as claimed in claim 1, wherein the encapsulation material has a coefficient of thermal expansion which is in the range of a coefficient of thermal expansion of the electronic component.

3. The method as claimed in claim 2, wherein the encapsulation material comprises a curable resin.

4. The method as claimed in claim 3, wherein the curable resin is an epoxy resin.

5. The method as claimed in claim 1, wherein, for the encapsulation of the electronic component using the encapsulation material, a shape is selected, in the case of which the movement of the encapsulation material in at least one direction falls below a predetermined value.

6. The method as claimed in claim 5, wherein the shape is selected such that a wall thickness of the encapsulation material on at least one wall of the electronic component falls below a predetermined value.

7. The method as claimed in claim 1, wherein the wiring carrier comprises a terminal for electrically contacting the electronic component with a printed circuit board and an electrical shielding layer, comprising arranging the electronic component on the wiring carrier such that the electronic component is accommodated, viewed in at least one direction of the electrical assembly, between the electrical shielding layer and the terminal.

8. An electronic assembly, which is produced using the method as claimed in claim 1, comprising:
- the electronic component supported on the wiring carrier, which is encapsulated using the encapsulation material,
- wherein the electronic component is arranged on the wiring carrier at the position of the wiring carrier at which the movements of the encapsulation material cancel each other out such that the stress introduction through the encapsulation material onto the electronic component falls below the predetermined value.

9. A method for producing an electronic assembly, in which an electronic component supported on a wiring carrier is encapsulated using an encapsulation material, comprising;
- arranging the electronic component on the wiring carrier at a position of the wiring carrier at which movements of the encapsulation material caused by changes in temperature of the encapsulation material during an encapsulating process cancel each other out such that a stress introduction through the encapsulation material onto the electronic component during the encapsulating process falls below a predetermined value,
- encapsulating the electronic component using the encapsulation material, and
- enveloping the electronic component with a mechanical decoupling layer before the encapsulating process.

* * * * *